(12) United States Patent
Bringoltz et al.

(10) Patent No.: US 11,874,606 B2
(45) Date of Patent: Jan. 16, 2024

(54) SYSTEM AND METHOD FOR CONTROLLING MEASUREMENTS OF SAMPLE'S PARAMETERS

(71) Applicant: NOVA LTD., Rehovot (IL)

(72) Inventors: Barak Bringoltz, Rishon le Tzion (IL); Ofer Shlagman, Tel-Aviv (IL); Ran Yacoby, Jerusalem (IL); Noam Tal, Mishmar Hashivaa (IL)

(73) Assignee: NOVA LTD., Rehovot (IL)

( * ) Notice: Subject to any disclaimer, the term of this patent is extended or adjusted under 35 U.S.C. 154(b) by 0 days.

(21) Appl. No.: 18/003,691

(22) PCT Filed: Jul. 6, 2021

(86) PCT No.: PCT/IL2021/050831
§ 371 (c)(1),
(2) Date: Dec. 29, 2022

(87) PCT Pub. No.: WO2022/009204
PCT Pub. Date: Jan. 13, 2022

(65) Prior Publication Data
US 2023/0185203 A1 Jun. 15, 2023

Related U.S. Application Data

(60) Provisional application No. 63/048,214, filed on Jul. 6, 2020.

(51) Int. Cl.
*G03F 7/20* (2006.01)
*G03F 7/00* (2006.01)

(52) U.S. Cl.
CPC ...... *G03F 7/70508* (2013.01); *G03F 7/70625* (2013.01)

(58) Field of Classification Search
CPC .................. G03F 7/70508; G03F 7/70625
See application file for complete search history.

(56) References Cited

U.S. PATENT DOCUMENTS

| 2005/0267607 A1 | 12/2005 | Paik |
| 2010/0312374 A1 | 12/2010 | Tsai et al. |
| 2014/0297211 A1 | 10/2014 | Pandev et al. |

FOREIGN PATENT DOCUMENTS

JP H1055949 A 2/1998

*Primary Examiner* — Mesfin T Asfaw
(74) *Attorney, Agent, or Firm* — Reches Patents

(57) ABSTRACT

A system and method are presented for controlling measurements of various sample's parameters. The system comprises a control unit configured as a computer system comprising data input and output utilities, memory, and a data processor, and being configured to communicate with a measured data provider to receive measured data indicative of measurements on the sample. The data processor is configured to perform model-based processing of the measured data utilizing at least one predetermined model, and determine, for each of one or more measurements of one or more parameters of interest of the sample, an estimated upper bound on an error value for the measurement individually, and generate output data indicative thereof.

26 Claims, 7 Drawing Sheets

_US 11,874,606 B2_

SYSTEM AND METHOD FOR CONTROLLING MEASUREMENTS OF SAMPLE'S PARAMETERS

TECHNOLOGICAL FIELD AND BACKGROUND

The present invention is in the field of model-based inspection/measurements of samples and relates to system and method for controlling measurements of various sample's parameters. The invention is particularly useful for measurements various features of patterned structures, e.g., semiconductor structures, which is useful for controlling the manufacturing process of such structures, as well as controlling the operational parameters of a measurement system.

Semiconductor structures, such as integrated circuits, become more complicated in the dimensions and shapes of pattern parameters. Accordingly, there exists an increasing need in providing accurate measurements of such parameters, which also enable measurements to be applied to structures progressing on a production line, i.e. automatic inspection/measurements (metrology, defect detection, process control, etc.) of patterned structures.

As the dimensions of semiconductor structures are shrinking, highly sensitive metrology tools and data analysis are required for monitoring the properties of the semiconductor structure. Metrology tools typically utilize Optical Critical Dimension (OCD) measurement technique (known also as Scatterometry) which is efficient for measuring parameters of patterned (periodic) structures, such as layer thicknesses, critical dimension (CD), line spacing, line width, wall depth, wall profile, etc. Measurements of structure parameters are typically model-based measurements performed using a fitting procedure, and extracting the structure parameter(s) from the model at its best fir condition with respect to measured data.

Various model-based measurement techniques are described for example in the following patent publications: US 20130124141; U.S. Pat. Nos. 9,904,993; 10,295,329; all assigned to the assignee of the present application.

GENERAL DESCRIPTION

There is a need for a novel approach of controlling/verifying measurements of various parameters of samples/structures, via error estimation in measurements, e.g., OCD metrology measurements.

Acceptability of a particular sample and/or particular sample manufacturing process, under the applicable quality standards, may depend on metrics (indicators related to quality assurance) defined according to certain criteria, and if a sample has unacceptable metrics, it may be rejected and/or one or more parameters of the process of its manufacture can be changed (optimized). Typically, measured data analyses are of the model-based type utilizing machine learning technique.

Shrinking dimensions and the growing complexity of the today's semiconductor manufacturing process is driving the metrology of such processes to its limits and makes it very hard to keep the metrology tools within the specifications required by the tight process limits. The accuracy, process robustness, precision, matching and other uncertainties involved with the metrology result, are very hard to achieve with current methods. In addition, other metrics like throughput (TPT), limitations of WIW sampling rates, are facing challenging requirements dictated by process control.

Finally, the difficulty in designing quality merits that are strongly correlated to the metrology accuracy is another increasingly emerging challenge that the community has been facing in the past decade. Such merits are to reasonably correlate with the inference model accuracy; are to be easy to calculate; and, ideally, are to be unsupervised (meaning that their availability is not predicated on the availability of references that are external to the inference model). Also, such merits are to be easy to calibrate at train time (when reference is available), and the calibration is to be stable.

The present invention provides a novel technique for controlling/verifying measurements of sample's parameter(s), utilizing model-based analysis of measured data, and evaluating/determining measurement errors. In this connection, it should be emphasized that the technique of the present invention provides an error bound estimation for each individual measurement of sample's parameter, rather than a general error estimation that does not depend on the characteristics (signal) of the individual measurement. The error estimation provided by the technique of the invention depends on the characteristics of the individually measured sample. More specifically, the invention provides estimation of bounds on the errors for each measurement individually, i.e. for each parameter from one or more parameters of interest in a sample being measured, rather than a general error of measured data provided by a measurement tool/system based on merit function based approach.

The measurement system typically provides measured data (e.g. in the form of a signature, e.g. spectral signature) embedding therein a set of multiple signals affected by and thus indicative of sample's parameters. The present invention provides a technique of processing such measured data and providing output data indicative of estimated upper bound on a measurement error for each measurement individually with respect to each of one or more parameters of interest. This enables to consider the measurement error for a specific parameter to decide as to whether measurements provided by a specific measurement tool (measurement scheme and measurement channel(s)) and/or measured data analysis based on a specific model, is sufficient or not for the specific parameter of the sample; as well as enables to consider the measurement error for one parameter with respect to measurement error(s) for one or more other parameter of interest to decide about an optimal model to be used for the data analysis.

The present invention takes advantages of the general principles of machine learning inference process, which is applied to a model after being trained (by running a specified subset of data into the model). The present invention provides novel modifications to both the training and inference test stages of the data analysis, enabling to extract from the measured data the error bound for each measurement. The model may be a machine learning model or a hybrid model of a combination of machine learning and physical models.

Thus, according to one broad aspect of the invention, it provides a system for controlling various measurements of various sample's parameters, the system comprising a control system configured as a computer system comprising: data input and output utilities, memory, and data processor, and being configured to communicate with a measured data provider to receive measured data collected from the sample, wherein the data processor is configured to perform model-based processing of the measured data utilizing at least one predetermined model, and determine, for each individual measurement of one or more parameters of interest of the sample, an estimated upper bound value for a measurement error, and generate output data indicative thereof.

It should be noted that the term "sample" used herein should be interpreted broadly covering also a measurement site in a structure (e.g. including multiple measurement sites).

The measured data (measured signal, e.g. spectra) can be represented by a multi-dimensional vector of $N_f$ components/elements.

The data processor may be configured to perform the model-based processing as follows: applying a training stage to at least one predetermined model to obtain a corresponding at least one trained model, and using said trained model to determine a functional relation between the measured data and an upper bound of an error for respective measurement individually; and performing an inference test stage by applying said functional relation to the measured data, to associate, the estimated upper bound of the error to a respective individual measurement and corresponding one or more parameters of a sample being measured.

In some embodiments, the training stage of the model-based processing comprises:

while training said at least one predetermined model using the measured data and a trainset, determining a distance metric, $D_F$, in a signal parametric space, and obtaining a trained model;

utilizing predicted model parameters of the trained model to determine a distance metric, $D_E$, in an error parametric space, for predicted measurement errors with respect to the trainset; and determining a relation between the upper bound of the error for the individual measurement and said distance metric $D_E$, thereby defining said functional relation between the measured data and the upper bound of the error for each measurement individually.

It should be understood that contrary to the common way to assess errors of regression (according to which training results are used to obtain for each parameter an average error from the training (cross-validation) scheme, and then set this number as a generic error estimation for the inference stage), the present invention utilizes the distance metric $D_F$ in a way that enables to obtain a different error estimation for each new sample.

The defining of the functional relation is based on geometric considerations that enable to infer from the distance metric, $D_E$, the upper bound on the error for each measurement of each of the one or more parameters being measured. Such geometrical considerations are based on assumption of a geometrical shape defined by the distribution of multiple error components of a multi-dimensional error vector.

For example, the shape of an error function may be regarded as hyper-ellipsoid in the error parametric space; and the errors are thus bounded by a rectangular encompassing such hyper-ellipsoid.

The training stage of the model-based processing may further include determination of a relation between the distance metric $D_F$ and the distance metric $D_E$, thereby enabling to directly determine the distance metric $D_E$ from the distance metric $D_F$ determined for the measured data.

The determination of said relation between the distance metric $D_F$ and the distance metric $D_E$ may include defining a correlation condition between two predetermined functionals of, respectively, the distance metric $D_F$ and the distance metric $D_E$.

In some embodiments, the data processor is configured to perform said determining of the distance metric $D_E$ in the error parametric space by carrying out the following:

determining a multi-dimensional error vector including $N_p$ error components for, respectively, $N_P$, values of the predicted model parameters of the sample; and utilizing said multi-dimensional error vector and the determined distance metric $D_F$ in the measured signal parametric space to determine the distance metric $D_E$ in the error parametric space.

In some embodiments, the data processor is configured to determine the relation between the distance metric $D_E$ in the error parametric space and the upper bound for each individual error component of said $N_P$ error components of the error vector.

The inference test stage may comprise performing, by the trained model, inference on the measured data of a sample being measured, by applying said functional relation between the measured data and the upper bounds of the errors to measured data; and determining the upper bound for the error for each measurement individually with respect to each parameter form said $N_p$ parameters of the sample.

The system may further include an error analyzer utility configured to analyze the measurement error for each of said one or more parameters of interest, and, upon identifying that said measurement error is above a certain value, generating corresponding alert data. For example, this certain value may be defined by a predetermined accuracy threshold, and/or may be determined based on a relation between measurement errors determined for at least two different parameters of the sample.

The measured data provider may be a storage device, which may or may not be part of a measurement system. In some embodiments, the control system is configured for data communication with an external measurement system/storage device, or may alternatively be integral with a measurement system configured for performing measurements on samples and generating (and storing) the measured data.

BRIEF DESCRIPTION OF THE DRAWINGS

In order to better understand the subject matter that is disclosed herein and to exemplify how it may be carried out in practice, embodiments will now be described, by way of non-limiting examples only, with reference to the accompanying drawings, in which:

FIGS. 3A and 3B exemplify analysis of the OCD measurements of wafers based on the use of distribution of the distance metric in the measured signal parametric space, wherein FIG. 3A shows how the wafer average of this metric behaves for a set of wafers, and FIG. 3B shows the OCD spectra for the bulk of corresponding wafers;

DETAILED DESCRIPTION OF EMBODIMENTS

Figure 1:
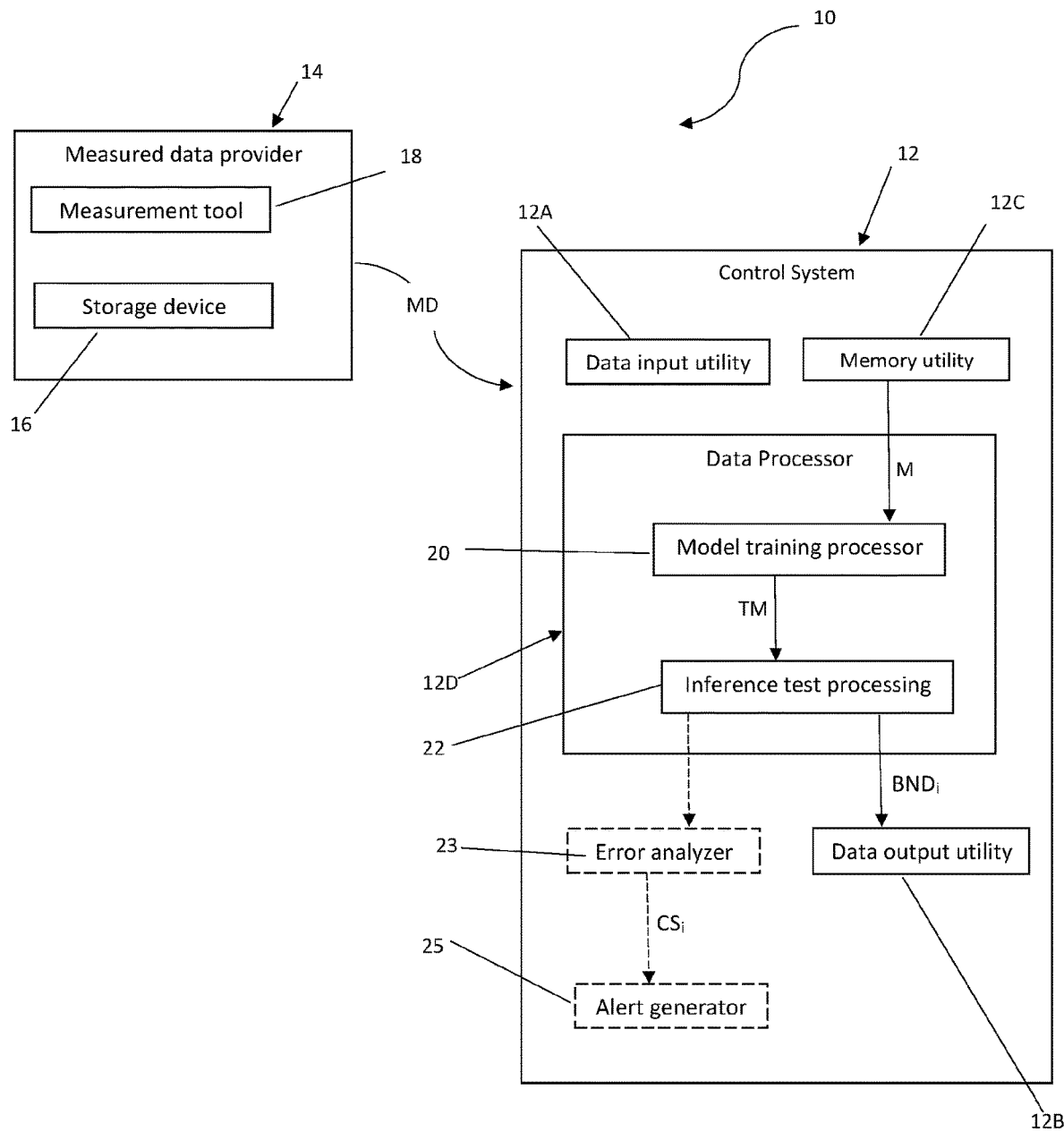
FIG. 1 is a block diagram of a control system of the present invention for controlling measurements of samples.

Reference is made to FIG. 1 illustrating, by way of a block diagram, a system 10 for managing (controlling/verifying) measurements of various sample's parameters. The system 10 includes a control system 12 which is configured for data communication with a measured data provider 14.

Such measured data provider 14 includes a storage device 16 storing measured data obtained by one or more measurement tools 18 in one or more measurement session conducted on the sample. The measurement tool(s) 18 may be part of the measured data provider 14. The measured data provider 14 may be an external system being in data communication with the control system 12 or may be part of/integral with the control system. Thus, in some embodiments, the system 10 is an integral system including the measurement system (measured data provider) 14 and the control system 12.

The control system 12 is configured as a computer system comprising inter alia data input utility 12A, data output utility 12B, memory 12C, and data processor 12D. The data processor 12D is configured to perform model-based processing of measured data MD received from the measured data provider 14 and determine parameter-related error data. The measured data MD is indicative of a measured signal (e.g. signature) whose components are affected by various parameters of the sample measured under given measurement conditions (measurement channel(s)).

The data processor 12D is configured and operable to process the measured data MD using predetermined model-based processing, according to the invention, based on at least one predetermined model, and determine, for each measurement (and thus for each of one or more parameters of the sample), a parameter-related individually estimated value for a measurement error for the respective parameter.

Thus, the parameter-related error data (e.g. measurement status for each i-th parameter of interest) provided by the processor may include one or more estimated bounds on error value (maximal value or error upper boundary) for each of one or more measurements individually with respect to one or more parameters of the sample; or alternatively or additionally such status data may include data indicative of whether or not such error satisfies the measurement requirements for said parameter. In other words, the processor determines, for each i-th parameter of interest, its measurement status based on a corresponding estimated maximal measurement error (upper bound for the measurement error).

More specifically, the data processor 12D is configured to perform model-based processing (e.g. machine learning type processing), and includes a first processor 20 configured to perform the model training stage with respect to the original (selected/predetermined) model M (e.g. stored in memory 12C) and obtain a trained model data TM and use the trained model data TM to define an error determination function describing a relation between the measured data and distribution of maximal error values for multiple measurements/parameters, respectively, affecting said measured data.

The data processor 12D further includes a second processor 22 configured to apply an inference test stage processing (so-called "run time") to the measured data (new measured data) using the error determination function and determine the measurement status for each parameter of interest. The result of the inference test stage processing is an estimated upper bound for error value $BND_i$ assigned to each i-th measurement/parameter individually from one or more parameters of interest of the sample being measured.

The selected model M may be of any known suitable type, e.g. a machine learning model, or any hybrid model being a combination of machine learning model and physical model.

As also shown in the figure, the control system 12 may include an error analyzer 23 configured to analyze the measurement error bound $BND_i$ for each i-th parameter of interest (e.g. based on predefined criteria), and, upon identifying that the measurement error bound is above a certain value, generating a corresponding control signal $CS_i$ to an alert generator 25. For example, this certain value may be defined by a predetermined accuracy threshold, and/or may be determined based on a relation between measurement errors determined for at least two different parameters of the sample.

The model based processing of the present invention provides for predicting a set of multiple parameters of a sample (or a measurement site in the sample) represented by a vector $\vec{p}$ of $N_p$ components $p_i$, i=1, 2, ..., $N_p$ and these components are outputs of a trained model TM resulted from training the original model M (selected/predetermined model) on a trainset $D_{train}$. For example, these parameters may be geometric (dimensional) and/or material parameters that describe the profile (2D or 3D) of a patterned structures for particular process step(s) like width, CD's, height, side wall angle, rounding, etc. (e.g., parameters of FIN in a FEOL advanced semiconductor manufacturing process).

The measured data MD, which the trained model TM obtains as input data, is represented by a vector $\vec{f}$, with $N_f$ components $f_j$, j=1, 2, ..., $N_f$, and can describe multiple type of measurements (e.g., metrology signals) at a multiple type of measurement channels. For example, such measurement channels may include reflectometry and/or ellipsometry measurements. The measured signals may represent values of the optical reflectivity across a set of optical wavelengths and at different illumination angles and polarizations of a spectral reflectometer, an angular scatterometer, or a spectral ellipsometer.

The output parameters' predictions of the model are denoted by $\hat{\vec{p}}$ and the ground truth (GT) values of these parameters is denoted by $\vec{p}_{GT}$. For brevity, $\vec{e}$ denotes the errors in the model prediction $\hat{\vec{p}}$:

$$\vec{e} = \hat{\vec{p}} - \vec{p}_{GT}. \qquad \text{Eq. 1}$$

The ground truth values of the parameters $\vec{p}_{GT}$ may be the result of a non-optical metrology such as a CDSEM or a cross sectional TEM, or in certain cases, it can also be the result of an optical metrology which uses a plentitude of optical channels and a physical/geometrical model which is very accurate when many optical channels are used.

Figure 2:
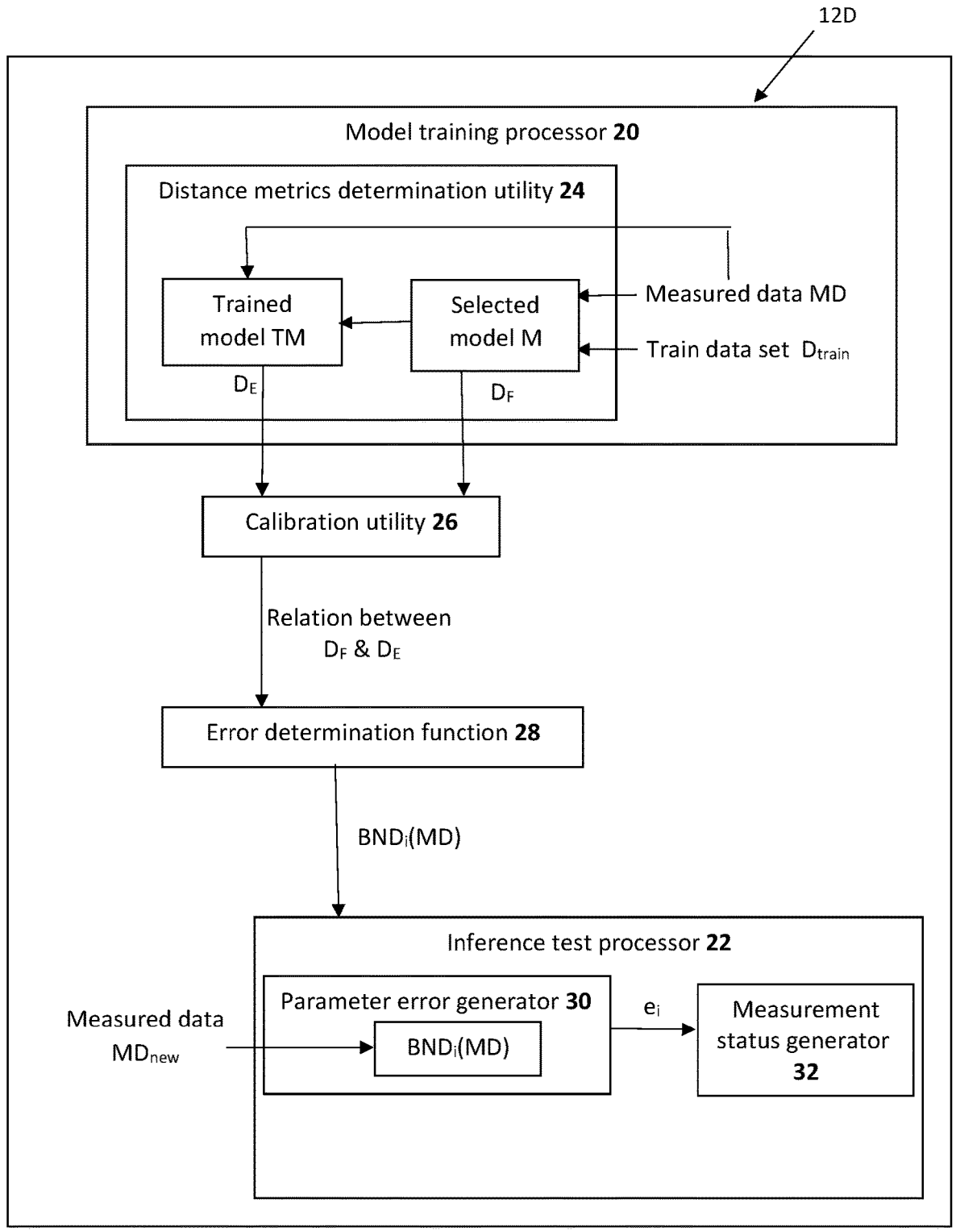
FIG. 2 is a block diagram exemplifying configuration and operation of a data processor utility of the control system of the invention.

Reference is made to FIG. 2 exemplifying the configuration and operation of the data processor 12D. As shown in the figure, the first processor 20 performing the model training stage includes a distance metrics determination utility 24, a calibration utility 26, and an error function determination utility 28; and the second processor 22 includes a parameter error generator 30 and a measurement status generator 32.

The distance metrics determination utility 24 is configured to process the measured data MD (measured signal) using a selected model M and predetermined trainset $D_{train}$ to determine a distance metric, $D_F$, in a signal space, with respect to the model trainset, and to determine a distance metric, $D_E$, in an error space, for measurement errors with respect to the model trainset. The calibration utility 26 is configured to determine a relation between the distance metrics $D_F$ and $D_E$. The error function determination utility 28 is configured to utilize geometric considerations to infer a relation, $BND_i(D_E)$, between the distance metric $D_E$ and an upper bound on the error $BND_i$ for each i-th measurement/parameter individually for the one or more parameters of the sample being measured.

The inference test processor 22 includes a parameter error generator 30 which utilizes the function $BND_i(D_E)$ to determine the parameter-specific (measurement-specific) maximal error in the real measured data, i.e. to assign to each parameter of interest of the sample being measured (e.g. of the specific measurement site in a structure under measurements) the maximal value of the possible measurement error. The processor 22 may further include the measurement status generator 32 which analyzes this maximal error with respect to the requirements for said parameter and generate respective data (e.g. alert).

The example of the operation of the model training processor will now be described in more details.

More specifically, the determination of the distance metric, $D_F$, in the signal space, includes defining and calculating a concept of a distance between any new, and possibly anomalous, measured data (set of signals), $\vec{f}_{new}$ and the trainset $D_{train}$. This may be for example the Euclidean distance between $\vec{f}_{new}$ and the center of the dataset, $\vec{f}_{center}$, in the trainset $D_{train}$. Thus, such distance metric, $D_F$, for the new set of signals, $\vec{f}_{new}$, can be determined as follows:

$$D_F(\vec{f}_{new}) \equiv |\vec{f}_{new} - \vec{f}_{center}|^2. \quad \text{Eq. 2}$$

or as the weighted distance metric $D_F^{(q,w)}$, $$D_F^{(q,w)}(\vec{f}_{new}) \equiv \sum_j w_j |f_{j,new} - f_{j,center}|^q. \quad \text{Eq. 3}$$

wherein w is the weighting factor which can depend on properties of the signal space at train time, such as the variance of each signal $f_j$ across the trainset, as it is encoded in the noise spectrum which can be measured by calculating its probability density, and any of its moments $\Gamma_p$ tensors, as follows:

$$\Gamma_p^{j_1, j_2, \cdots, j_p}(D_{train}) \equiv \langle f_{j_1} f_{j_2} \cdots f_{j_p} \rangle_{train\ set}, \quad \text{Eq. 4}$$

wherein $\langle , \rangle_{trainset}$ is the ensemble average across the trainset.

For example, the Euclidean distance weighted by the second moment of the trainset is as follows:

$$D_F^{(q,w=w_2)} \equiv \frac{\sum_j \left( \frac{|f_{j,new} - f_{j,center}|^q}{\sqrt{\Gamma_2^{j,j} - (\Gamma_1^j)^2}} \right)}{\sum_j \frac{1}{\sqrt{\Gamma_2^{j,j} - (\Gamma_1^j)^2}}} \quad \text{Eq. 5}$$

Generally, weighting factor w is a function of any combination of K moment tensors $$\Gamma_{p_1}^{j_1, j_2, \cdots, j_{p_1}}, \Gamma_{p_2}^{j_1, j_2, \cdots, j_{p_2}}, \Gamma_{p_K}^{j_1, j_2, \cdots, j_{p_K}}.$$

This set of moments can be denoted by $\{\Gamma\}$, and the more general distance metric can be written as follows:

$$D_F^{(q1,q2,w)} \equiv \Sigma w_{j_1 j_2}(\{\Gamma\})(f_{j_1,new} - f_{j_1,center})^{q1} (f_{j_2,new} - f_{j_2,center})^{q2}. \quad \text{Eq. 6}$$

The parameter q and the choice of weight w is a hyper parameter of the metric. Additional hyper parameter may include any regularization attributes that aim to eliminate the sensitivity of $D_F$ to noises of different types and make it more robust. This will be described further below.

Another possible example for determination of the distance metrics in the signal space $D_F$ is by calculating the pairwise weighted distances between the new measurement $\vec{f}_{new}$ and any of the measurements $\vec{f}_{train}^{(I)}$ in the trainset $I \in D_{train}$. These distances can be then further weighted by a weight $\rho$ which can depend on metadata (such as the time span between the dates of the pair members):

$$D_F^{(q,w,pairwise,\rho)}(\vec{f}_{new}) \equiv \frac{\sum_{Ij} \rho_I \cdot |f_{j,new} - f_{j,train}^{(I)}|^q}{\sum_I \rho_I} \quad \text{Eq. 7}$$

or the following generalization thereof:

$$D_F^{(q1,q2,w)} \equiv \Sigma w_{j_1 j_2}(\{\Gamma\}) \rho_{I_1,I_2} (f_{j_1,new} - f_{j_1}^{(I1)})^{q1} (f_{j_2,new} - f_{j_2}^{(I2)})^{q2}. \quad \text{Eq. 8}$$

It should be noted that upon defining the merit of the distance metrics $D_F$ and training it across the trainset, it can be applied at inference time and used as a statistical analysis of the results to make decisions. For example, a threshold can be set for the per-measurement value for $D_F$ to determine whether the sample is anomalous and generate corresponding alert. Also, the distribution of $D_F$ from a set of samples (such as a single wafer or lot) can be analyzed to make decisions based on its average, variance, and so on.

Setting the rules and thresholds on the distance in the signal space $D_F$ and its statistical properties can be done at any of the above levels, as well as generalizations thereof (such as a group of wafers that belong to a given process DOE or framed at a given time interval). Some methods to set these thresholds will be described further below.

Figure 3B:
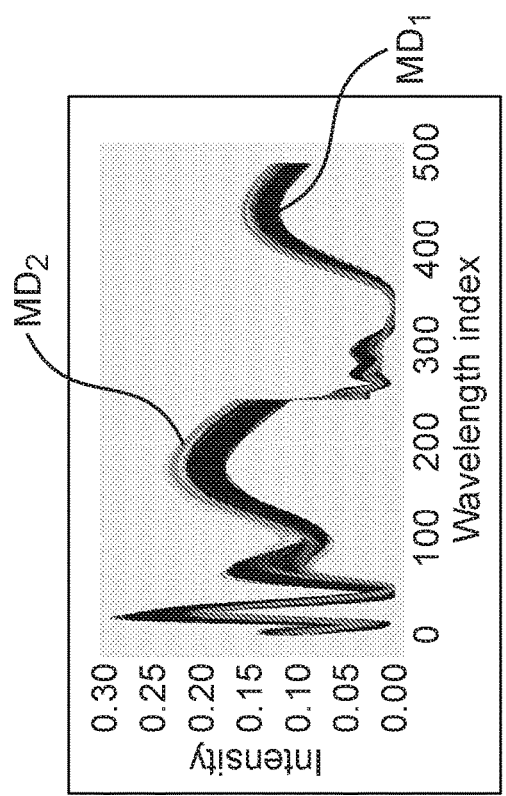
Figure 3A:
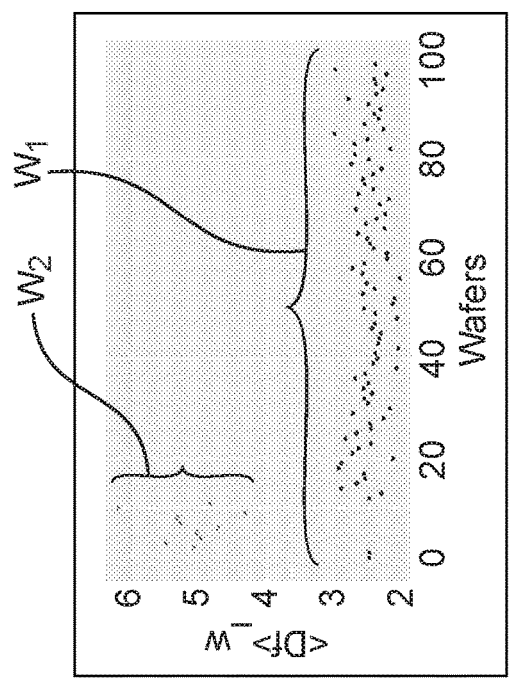

FIG. 3A illustrates an example for how the wafer average (wafer mean value) of the merit $D_F^{(q=2,w=1,pairwise,\rho=1)}$ of Eq. 7 behaves for a set of wafers. Here, the measured data includes OCD measurements at normal illumination angle and two polarization channels. Wafers $W_1$ are wafers in the normal distribution, and wafers $W_2$ are anomalous wafers.

FIG. 3B shows the OCD spectra for the bulk of wafers whose $D_F^{(q=2,w=1,pairwise,\rho=1)}$ of FIG. 3A is normal (measured data $MD_1$) and the OCD spectra of the wafers whose $D_F^{(q=2,w=1,pairwise,\rho=1)}$ of FIG. 3A 'jumps' to anomalous values (measured data $MD_2$).

It should be noted that the process by which the distance metrics in the signal space $D_F$ is defined and calculated can be considered as 'training' of the function $D_F$ to calculate values of this attribute for given new set of measured signals, $\vec{f}_{new}$, as demonstrated by Eq. 4 above.

Turning back to FIG. 2, the distance metrics determination utility 24 is also configured to determine the distance metric, $D_E$, in error space, for measurement errors with respect to the model trainset. To this end, similar methodology can be used to that for the determination of the distance metrics $D_F$, but modified for the error parametric space. More specifically, the same equations and methods described above can be used with the following replacement:

$$\vec{f} \rightarrow \vec{e} \quad \text{Eq. 9}$$

performed for each sample, taking into account that the vector $\vec{f}$ is $N_f$-dimensional and the vector $\vec{e}$ is $N_p$-dimensional, $\vec{e}=(e_1, e_2, \ldots e_{N_p})$ where $N_p$ is the number of predicted parameters:

$$D_E^{(q,w)}(\vec{e}_{new})=\Sigma_{i=1}^{N_p} w_i |e_{i,new}-e_{i,center}|^q \qquad \text{Eq. 3a}$$

Thus, the distance metrics determination utility 24 implements a training scheme (which at this stage may be any known suitable scheme) to obtain, for each sample (e.g. constituted by a measurement site in a structure), the $N_p$-dimensional error vector $\vec{e}$, and calculates, for each sample, the distance metrics $D_F$ (using Eq. 5 or Eq. 7 above).

The distance metrics $D_F$ can then be used to obtain distance metrics $D_E$ for each sample (Eq. 9 above).

It should be noted that if distance metrics $D_E$ correlates to distance metrics $D_F$ in accordance with a well-defined relation (function), the function that relates $D_E$ to $D_F$ can be determined and used, which means that for each new measurement, distance metrics $D_E$ can be directly calculated from the "measured" distance metrics $D_F$ using this relation/function. This may, for example, be a linear function.

To this end, the calibration utility 26 performs calibration of distance metrics $D_E$ to distance metrics $D_F$.

Preferably, a threshold on $D_F$ is to be set. The following is an example for setting such threshold:

Functional dependences A(x; h) and B(x; g) are defined, where h and g denote a collection of hyper-parameters that define A and B. The basic choice of the functions A and B (for example logarithmic or polynomial) can be considered as a hyper-parameter as well.

Using validation and cross-validation methodologies, optimization over the tuple (h, g) is performed, and $(h_0, g_0)$ is calculated for which $A(x=D_E; h=h_0)$ is strongly correlated to $B(x=D_F; g=g_0)$ across the trainset samples. With these validation and cross-validation methodologies, the correlation between $A(x=D_E; h=h_0)$ and $B(x=D_F; g=g_0)$ is used to calibrate A to B.

For example, with a quadratic correlation the outcome is the following model/relation:

$$A=\alpha+\beta \cdot B+\gamma \cdot B^2$$

which predicts A from B. Higher capacity models can also be considered such as kernel regression, neural networks, tree regressors, etc.

Figure 4:
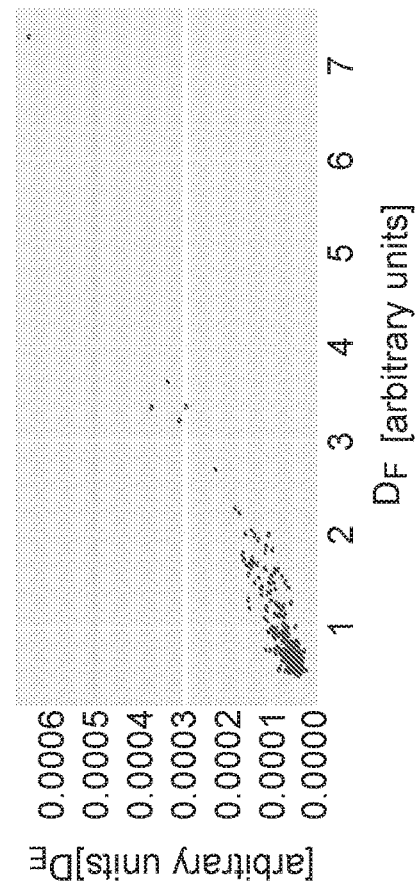
FIG. 4 exemplifies correlation between $D_E$ and $D_F$, defined according to the considerations of the present invention.

For example, FIG. 4 illustrates the correlation between $B=D_E$ and $A=D_F$, both defined through Eq. 6 above. The "shape" exemplified in FIG. 4 corresponds to calculation of $D_E$ and $D_F$ using Eq. 6. The data in the figure represents the averages across all dies (measurement sites) within a given wafer for around 300 wafers and for $N_p=10$, and $N_f=980$. The resulting Pearson correlation coefficient is 0.94.

The way a threshold is set depends on the definition of B. For example, in the simplest case, where $N_p=1$, and $A=D_E^{(q=1,w=1)}$, for each measurement we have:

$$e=\pm A$$

In this case, the accuracy spec $\Delta$ can be used as the threshold for $|e|=A$, thereby flagging, for each measurement or for each group of measurements where the error is larger than the spec.

In some other cases, where, for example, $N_p=2$ and $A=D_E^{(q=4,w=1)}$, an equation that describes the connection between the two errors $e_1$ and $e_2$ is as follows:

$$e_{1,2} = \pm(A - e_{2,1}^4)^{\frac{1}{4}} \qquad \text{Eq. 10}$$

Then, for a given value for A, the following can be done:

Prior information on $e_{1(2)}$ is used to obtain knowledge on $e_{2(1)}$, through Eq. 10. For example, if $p_1$ is a parameter for which there is an external reference and $p_2$ is not, this reference data can be used to determine whether $e_2$ is in spec and flag the associated measurement otherwise.

Figure 5B:
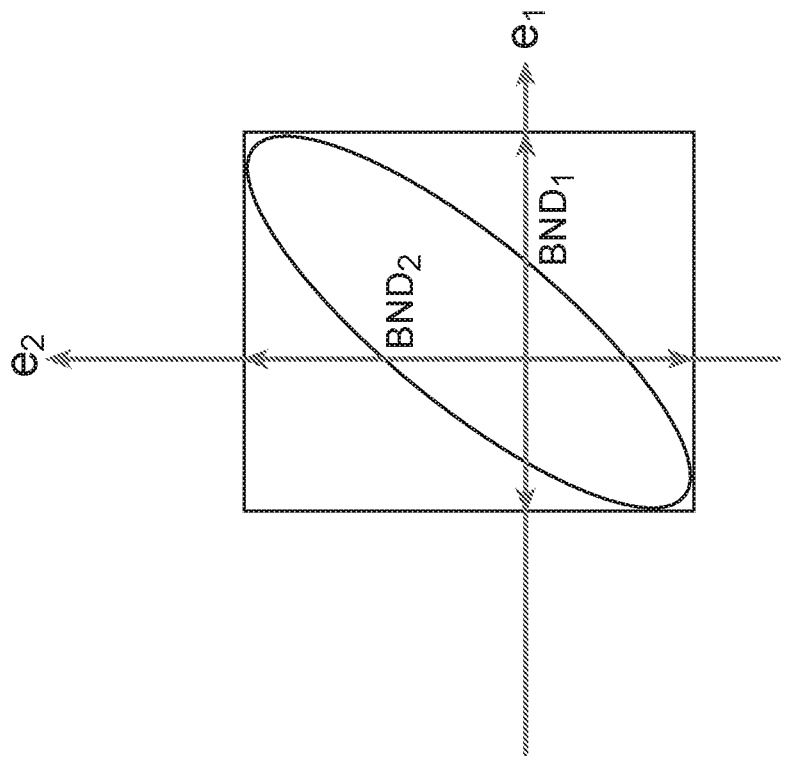
FIGS. 5A and 5B exemplifies, by pictorial representation, how an upper bound $BND_i$ can be determined for the error in the individual i-th parameter.
Figure 5A:
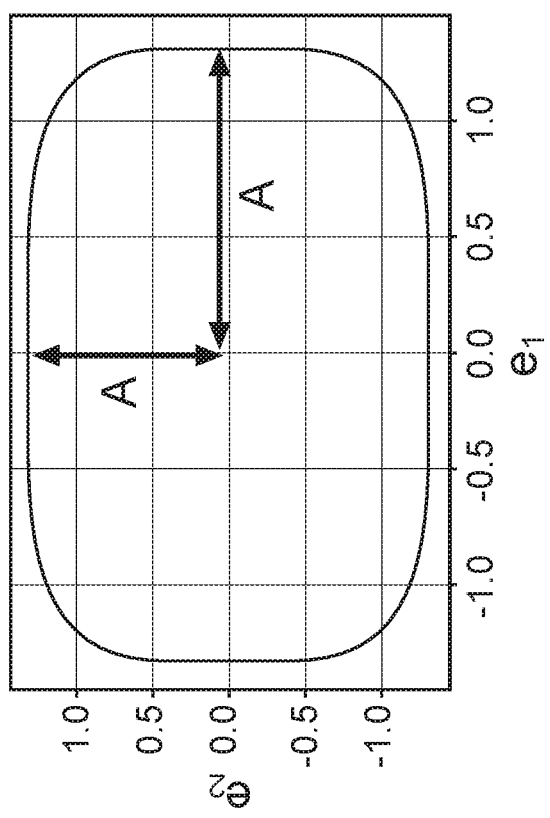
Figure 6A:
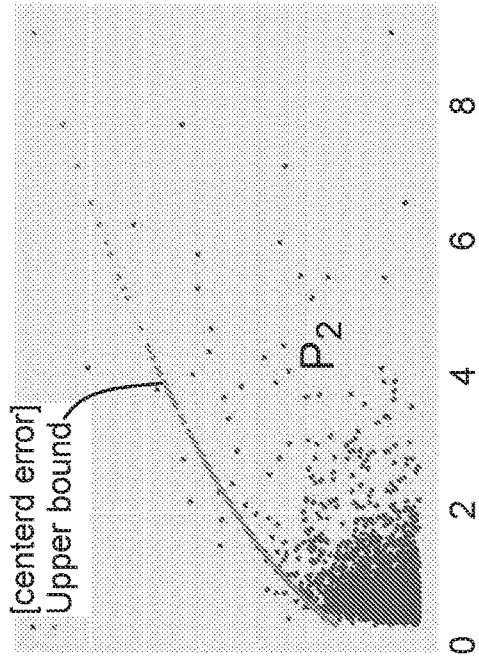
FIGS. 6A to 6D show the results for calculated $D_F$ and $D_E$ for four parameters, respectively, based on the correlation illustrated in FIG. 5A.
Figure 6B:
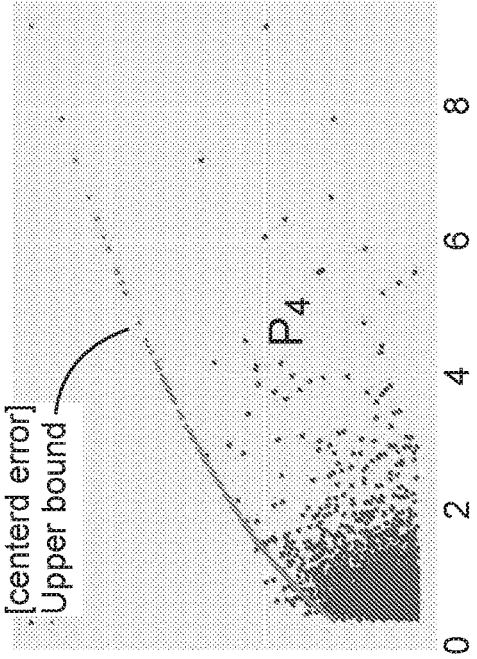
Figure 6C:
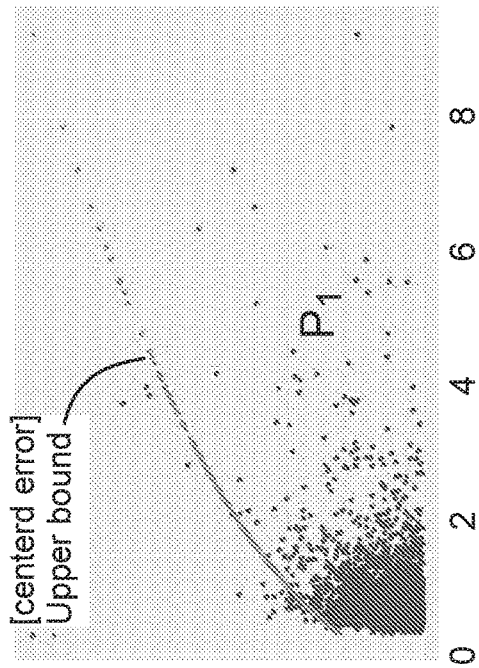
Figure 6D:
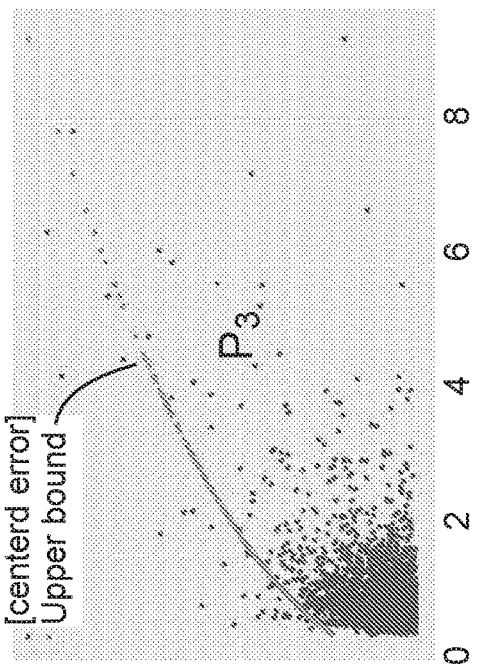

In the absence of such prior information, and in cases where equations 6 and 8 represent a closed shape (like Eq. 10), a bound $BND_i(A)$ can be determined for the error in the individual parameters $i=1, 2, \ldots, N_p$. For example, in the two-dimensional case of Eq. 10, FIG. 5A illustrates a pictorial representation of the case of $N_p=2$ and $A=D_E^{(q_1=q_2=4,w=1)}$. While the errors in the parameters can vary in a finite range, and there is a finite uncertainty associated with both, they are both bounded by $\pm A$. Hence, the bounds for A are:

$$BND_1=BND_2=A, \qquad \text{Eq. 11}$$

Any measurements whose $BND_{1,2}$ (now calculable at real time from $D_F$ through the correlation between B and A and Eq. 10) is larger than the corresponding customer spec for the accuracy in $p_1$ or $p_2$ can be flagged.

The generalization of the above case is straightforward: the calibration of A to B done at train time can be used to estimate B from A. Then, and once A is measured and ascertains the value A=a, and when the functional form of A($\vec{e}$)=a is that of a closed $N_p$-dimensional shape, the $N_p$-dimensional hypercube can be found that bounds this shape, and its sides can be used to define the bounds on each of the parameters. This is exemplified in FIG. 5B.

As described above, the geometrical considerations utilized herein are based on assumption of a geometrical shape defined by the distribution of multiple error components of a multi-dimensional error vector. For example, error function may be regarded as hyper-ellipsoid in the error parametric space; and the errors are thus bounded by a rectangular encompassing such hyper-ellipsoid.

Considering Eq. 3a above, in 2D projection with q=2, we have:

$$D_E=w_1|e_{1,new}-e_{1,center}|^2+w_2|e_{2,new}-e_{2,center}|^2 \qquad \text{Eq. 12}$$

which defines an ellipse in error space, and error $e_2$ (for parameter $N_2$) can be represented in terms of error $e_i$ for parameter $N_1$.

Therefore plotting $e_2$ as a function of $e_1$ will result in an ellipse as shown in the figure. The ellipse is bounded by a rectangle, which defines an upper bound on the error of each parameter. In the figure, the vertical edge of the rectangle defines a bound $BND_2$ on the error component $e_2$ and the horizontal edge defines a bound $BND_1$ on the error component $e_1$.

In higher dimensions ($N_p>2$), $D_E$ defines a hyper-ellipsoid in $N_p$ dimensional space and the edges of hyper-cube that bounds the hyper-ellipsoid define the upper bounds on each error components.

As an example, FIGS. 6A to 6D show the results of using Eq. 6 for A and B for four parameters $P_1$, $P_2$, $P_3$, $P_4$, respectively, out of the ten parameters whose correlation A and B is illustrated in FIG. 5A. The data presented in these figures is for die-level predictions of the error, where scattered points correspond to error magnitudes, le, for the errors from the prescription above for the above parameters, and the bound is presented by the monotonously increasing points); the Y axis shows the error and the X axis is the value of B. The figures show that the bound is efficient: the bulk of the points are below it on one hand, and on the other, it is not a loose bound.

Thus, turning back to FIG. 2, the error determination utility 26 is configured to utilize the above described geometric considerations to determine an upper bound on the error $BND_i$, from the distance metric $D_E$, for each i-th parameter individually, of the one or more parameters of the sample being measured.

Figure 7A:
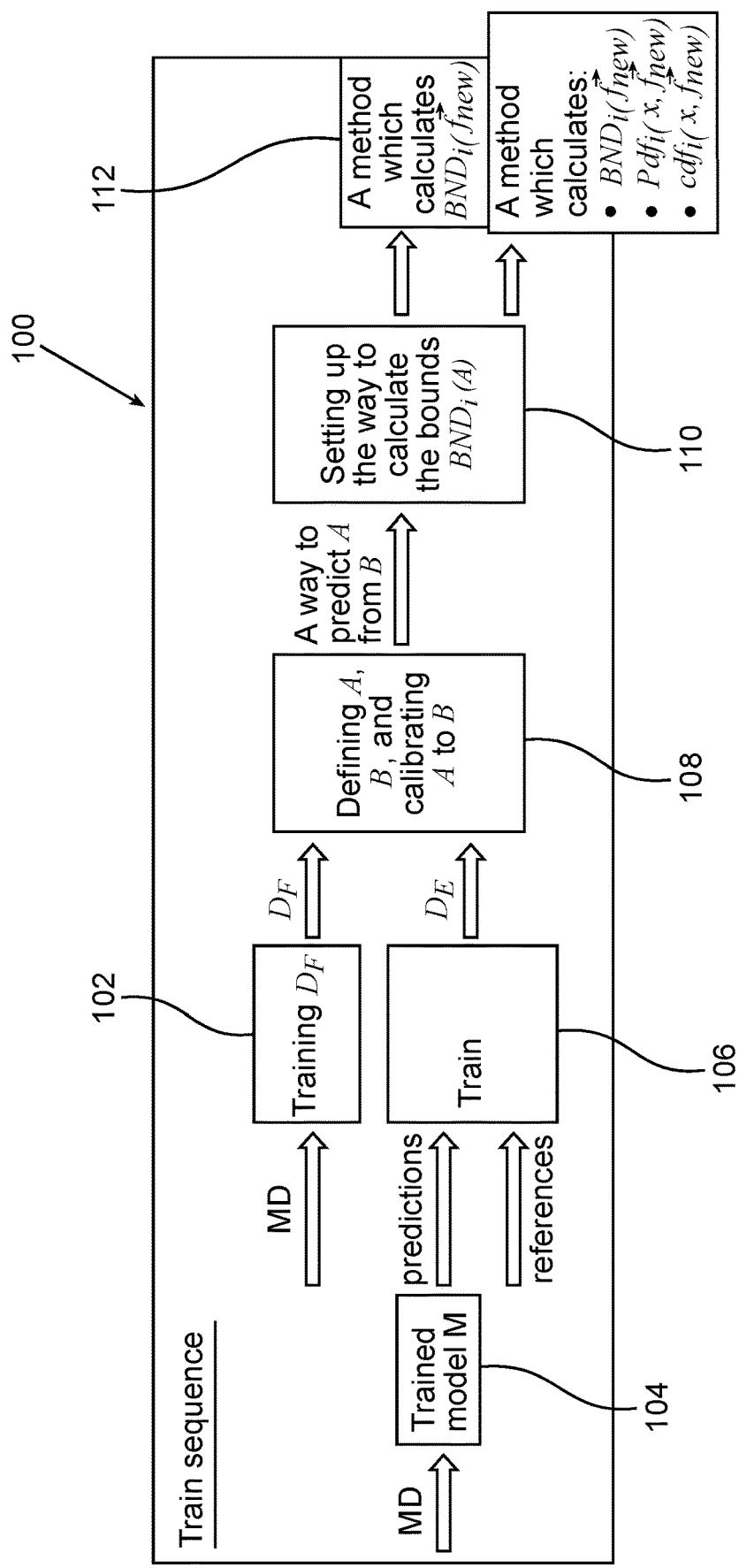
FIGS. 7A and 7B exemplify, by way of flow diagrams, the implementation of the training and inference test stages according to the present invention.
Figure 7B:
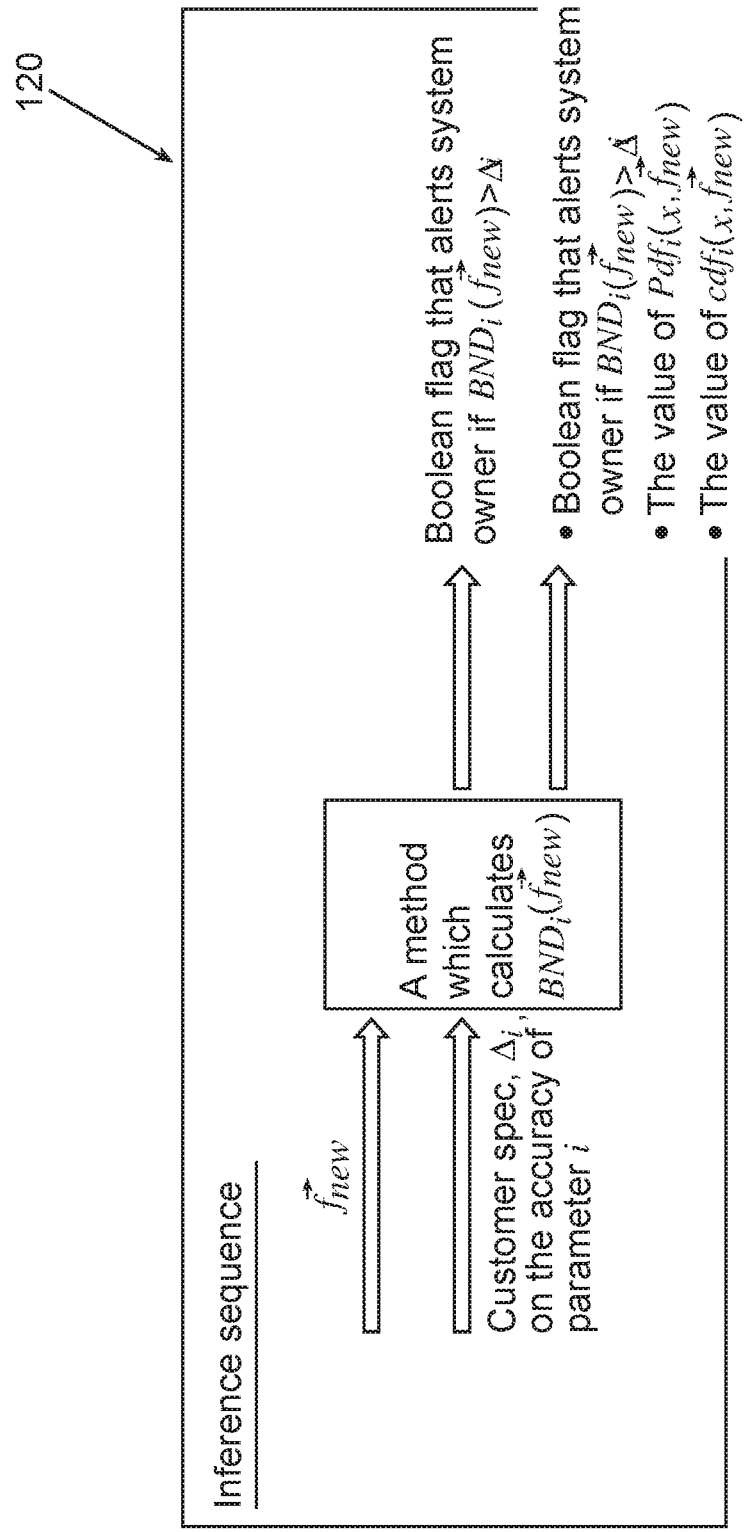

Reference is made to FIGS. 7A and 7B illustrating more specifically an example of the operation of the processors 20 and 22 of the data processor 12D.

FIG. 7A shows a flow diagram 100 of the model training stage performed by processor 20. As shown, a selected model M is trained using input measured data MD to determine the distance metrics $D_F$ in the signal parametric space for each sample as described above with reference to Eq. 5 (step 102). The trained model is used, being input with the measured data MD, to predict, for each sample, an error vector $\vec{e}=(e_1, e_2, \ldots e_{N_p})$ for $N_p$ predicted parameters as described above with reference to Eq. 9 (step 104). From this predicted error vector (and possibly also some reference data or prior knowledge), the distance metrics $D_E$ in the error parametric space is determined (step 106). The calibration considerations are applied to the so-determined distance metrics $D_F$ and $D_E$ (step 108) to determine a prediction model that predicts $D_E$ from $D_F$. Then, estimated/predicted determination of $D_E$ from $D_F$ and geometrical considerations are used to determine the function $BND_i(A)$, being a calculation model (the way to calculate) for calculating the upper bound $BDN_i(A)$ which, as described above, is in turn indicative of $BND_i(D_E)$ for each individual i-th error component of the error vector with respect to the i-th parameter of the sample (step 110) and generate corresponding training stage result 112 (method for calculation of at least $BND_i(\vec{f}_{new})$ to be used by the inference stage processor 22.

FIG. 7B exemplifies a flow diagram 120 of the inference stage processing. At this stage, the trained model implements the above method to perform the inference on a measured signal vector of a new sample, $\vec{f}_{new}$, and predicts the $N_p$ parameters/components of the error vector.

As described above, for the measured signal vector the distance metrics $D_F$ can be calculated, and used for inferring the distance metrics $D_E$ using the relation between these distance metrics in the training stage. The so-determined $D_E$ is used to calculate the upper bound $BND_i$ for the error of each i-th parameter. As a result, the trained model attaches/assigns the error estimation to each measurement individually of each of one or more measured parameters of the sample.

Turning back to FIGS. 6A-6D, it can be seen that the above technique enables to provide more information to the user about the distribution of the errors per given value of B (and thus for distance metrics $D_F$) or per a given interval of values of B. To this end, the probability density function $Pdf(e_i=x, \vec{f}_{new})$ and the cumulative distribution function $cdf(e_i \leq x, \vec{f}_{new})$ can be calculated. At inference stage, these functions can be used to evaluate the probability of the parameters to fall near the boundary line. This is also indicated in FIGS. 7A and 7B.

The above described technique of the present invention can be generalized into a wafer-level process or a group-level process by merging multiple dies in a given wafer or group. This can be performed as follows:

At a preprocessing step, an average of the measured signal and error vectors can be determined over a wafer or group. Then, the distance metrics $D_E$ and $D_F$ are determined as described above, and the wafer or group average of these distance metrics are determined (that are both fundamentally defined at a die level). The above-described calibration of $D_E$ to $D_F$ is applied to the die level $D_F$ to obtain therefrom an estimate for the die-level $D_E$. The results are then used to obtain the die-level bound, and average over it to obtain a wafer/group level anomaly index. For a given case of $N_g$ dies within a given wafer or group, the die-level signal vectors $\vec{f}$ and/or error vectors e of these dies are concatenated, and the new $N_g \times N_f$-dimensional signal vectors and the $N_g \times N_p$-dimensional error vectors are used as the inputs for the above-described calibration and thresholding procedures. The bounds per parameter data for multiple dies within the given wafer/group can then be averaged.

As mentioned above, preferably the sensitivity of distance metrics $D_F$ to noises of different types is to be eliminated to make this measure more robust. Indeed, the measured signals are always noisy, $$\vec{f}^{(meas.)} = \vec{f}^{(true)} + \vec{e} \qquad \text{Eq. 13}$$

where the distribution of $\vec{f}^{(true)} \sim p_{process}$ is related to the manufacturing process, and that of $\vec{e} \sim p_{measurement}$ to the measurement procedure itself. In order to incorporate the effects of measurement noise into the distance measures, the above definitions can be modified by averaging over both sources of variations in the data. For example, Eq. 12 becomes:

$$\Gamma^{j1,j2,\ldots jp} = \langle f_{j_1}^{(obs.)} f_{j_2}^{(obs.)} \ldots f_{j_p}^{(obs.)} \rangle \qquad \text{Eq. 14}$$

where the average is taken over the joint probability distribution $p(\vec{f}^{(true)}, \vec{\varepsilon})$.

Ideally, the above average is estimated empirically on a trainset, in which the measurement of each sample is repeated several times to simulate measurement noise. Practically, measurement noise is rarely estimated in this way due to throughput requirements. Instead, the noise is either estimated theoretically, or empirically on a few distinguished samples. This makes it hard to estimate the joint distribution, and thus the above average.

To simplify, an assumption can be made that $\vec{f}^{(true)}$ and $\vec{e}$ are statistically independent. The independence assumption can be relaxed when only part of the moments are needed; for example if only the $2^{nd}$ moment enters the definition of the distance, as in Eq. 5, it is enough to assume $\vec{f}^{(true)}$ and $\vec{e}$ are uncorrelated.

In this case, the above average can be estimated from the ordinary trainset and the independent estimates of $p_{measurement}$ (typically, only the first few moments are required).

Thus, the present invention provides a novel approach for controlling/verifying measurements of various samples' parameters. This approach provides for accompanying/assigning to the parameter measured value the evaluated upper bound for the individual measurement error of said parameter.

What is claimed is:

1. A system for controlling measurements of various sample's parameters, the system comprising:
   a control unit configured as a computer device comprising data input and output utilities, memory, and
   a data processor, and being configured to communicate with a measured data provider to receive measured data indicative of measurements on the sample, wherein the data processor is configured to perform model-based processing of the measured data utilizing at least one predetermined model, and determine, for each of one or more measurements of one or more parameters of interest of the sample, an estimated upper bound on an error value for the measurement individually, and generate output data indicative thereof;
   wherein said data processor is configured to perform said model-based processing comprising:
   applying a training stage to at least one predetermined model to obtain a corresponding at least one trained model and using said trained model to determine a functional relation between the measured data and upper bounds on errors for each measurement individually of each respective sample's parameter affecting the measured data; and
   performing an inference test stage by applying said functional relation to the measured data, to associate the individually estimated upper bound of the error value individually with each of said one or more parameters of a sample being measured;
   wherein said training stage of the model-based processing comprises:
   while training said at least one predetermined model using the measured data and trainset, determining a distance metric, $D_F$, in a signal parametric space, and obtaining a trained model;
   utilizing predicted model parameters of the trained model to determine a distance metric, $D_E$, in an error parametric space, for predicted measurement errors with respect to the model trainset; and
   determining a relation between the upper bounds of errors for the sample's parameters and said distance metric $D_E$, thereby defining said functional relation between the measured signals and the upper bounds of the errors.

2. The system according to claim 1, wherein the measured data is indicative of a measured signal affected by one or more parameters of the sample, the data processor being configured to represent the measured data by a multi-dimensional vector of $N_f$ components.

3. The system according to claim 1, wherein the at least one predetermined model comprises at least one from the following: machine learning model and a hybrid model being a combination of a machine learning model and a physical model.

4. The system according to claim 1, wherein said training stage of the model-based processing further comprises: determining a relation between the distance metric $D_F$ and the distance metric $D_E$, thereby enabling to directly determine the distance metric $D_E$ from the distance metric $D_F$ determined for the measured data.

5. The system according to claim 4, wherein said determining of said relation comprises defining a correlation condition between two predetermined functionals of, respectively, the distance metric $D_F$ and the distance metric $D_E$.

6. The system according to claim 1, wherein the data processor is configured to perform said determining of the distance metric $D_E$ in the error parametric space by carrying out the following:
   determining a multi-dimensional error vector including $N_p$ error components for, respectively, $N_P$ values of the predicted model parameters of the sample; and
   utilizing said multi-dimensional error vector and the determined distance metric $D_F$ in the signal parametric space to determine the distance metric $D_E$ in the error parametric space.

7. The system according to claim 1, wherein the data processor is configured to determine the relation between the distance metric $D_E$ in the error parametric space and the upper bound for each individual error component of said $N_P$ error components of the error vector.

8. The system according to claim 1, wherein said inference test stage comprises: performing, by the trained model, inference on the measured data of a sample being measured, by applying to measure data said functional relation between the measured signals and the upper bounds of the errors; and determining the upper bound for the error for each individual parameter form said $N_P$ parameters of the sample.

9. The system according to claim 1, further comprising an error analyzer utility configure and operable to analyze the measurement error for each of said one or more parameters of interest and upon identifying that said measurement error can be above a certain value, generating corresponding alert data.

10. The system according to claim 9, wherein said certain value is a predetermined accuracy threshold.

11. The system according to claim 9, wherein said certain value is determined based on a relation between measurement errors determined for at least two different parameters of the sample.

12. The system according to claim 1, further comprising a measurement system configured for performing measurements of samples and generating and storing said measured data, thereby operating as said measured data provider to communicate the measured data to said control unit.

13. A system for controlling measurements of various sample's parameters, the system comprising:
   a control unit configured as a computer device comprising data input and output utilities, memory, and
   a data processor, and being configured to communicate with a measured data provider to receive measured data indicative of measurements on the sample, wherein the data processor is configured to perform model-based processing of the measured data utilizing at least one predetermined model, and determine, for each of one or more measurements of one or more parameters of interest of the sample, an estimated upper bound on an error value for the measurement individually, and generate output data indicative thereof;
   wherein said data processor is configured to perform said model-based processing comprising:
   applying a training stage to at least one predetermined model to obtain a corresponding at least one trained model and using said trained model to determine a functional relation between the measured data and upper bounds on errors for each measurement individually of each respective sample's parameter affecting the measured data; and
   performing an inference test stage by applying said functional relation to the measured data, to associate the individually estimated upper bound of the error value individually with each of said one or more parameters of a sample being measured, wherein said training stage comprises: while training the at least one predetermined model using the measured data and a trainset, determining a distance metric, $D_F$, in a signal parametric space, and training said distance metric, $D_F$, across the trainset;

the inference test stage further comprises: utilizing the distance metric $D_F$ in the signal parametric space for statistical analysis of the measurements for said one or more parameters.

14. The system according to claim 13, wherein said statistical analysis utilizes a preset threshold value for the distance metric, $D_F$, thereby enabling to use said threshold value to estimate whether the sample being measured is anomalous and generate a corresponding alert.

15. The system according to claim 13, wherein said statistical analysis comprises analysing distribution of values of the distance metric, $D_F$, for a set of samples and determining whether a specific sample from said set of samples is anomalous or not.

16. A method for controlling measurements of various sample's parameters, the method comprising:

providing measured data indicative of multiple measured signals affected by parameters of a sample; and utilizing at least one predetermined model to apply model-based processing to the measured data, and determine, for each of one or more parameters of interest, an estimated upper bound value for an individual measurement for said parameter, and generate output data indicative thereof;

wherein said data processing comprises:

applying a training stage to at least one predetermined model to obtain a corresponding at least one trained model and using said trained model to determine a functional relation between the measured signals and upper bounds of errors for sample's parameters affecting the measured signals; and performing an inference test stage by applying said functional relation to the measured data, to associate the estimated upper bound of the error value individually with each of said one or more parameters of a sample being measured;

wherein said training stage of the model-based processing comprises:

while training said at least one predetermined model using the measured data and trainset, determining a distance metric, $D_F$, in a signal parametric space, and obtaining a trained model;

utilizing predicted model parameters of the trained model to determine a distance metric, $D_E$, in an error parametric space, for predicted measurement errors with respect to the model trainset; and determining a relation between the upper bounds of errors for the sample's parameters and said distance metric $D_E$, thereby defining said functional relation between the measured signals and the upper bounds of the errors.

17. The method according to claim 16, wherein the measured data is indicative of a measured signal affected by parameters of the sample, said data processing comprising representing the measured data by a multi-dimensional vector of $N_f$ components.

18. The method according to claim 16, wherein said training stage of the model-based processing further comprises: determining a relation between the distance metric $D_F$ and the distance metric $D_E$, thereby enabling to directly determine the distance metric $D_E$ from the distance metric $D_F$ determined for the measured data.

19. The method according to claim 18, wherein said determining of said relation comprises defining a correlation condition between two predetermined functionals of, respectively, the distance metric $D_F$ and the distance metric $D_E$.

20. The method according to claim 16, wherein said determining of the distance metric $D_E$ in the error parametric space comprises:

determining a multi-dimensional error vector including $N_p$ error components for, respectively, $N_p$ values of the predicted model parameters of the sample; and utilizing said multi-dimensional error vector and the determined distance metric $D_F$ in the measured signal parametric space to determine the distance metric $D_E$ in the error parametric space.

21. The method according to claim 16, further comprising analyzing the measurement error for each of said one or more parameters of interest and upon identifying that said measurement error can be above a certain value, generating corresponding alert data.

22. The method according to claim 21, wherein said certain value is a predetermined accuracy threshold.

23. The method according to claim 21, wherein said certain value is determined based on a relation between measurement errors determined for at least two different parameters of the sample.

24. The method according to claim 16, wherein said sample is a measurement site in a patterned structure.

25. The method according to claim 16, wherein said sample is a measurement site in a semiconductor wafer.

26. A method for controlling measurements of various sample's parameters, the method comprising:

providing measured data indicative of multiple measured signals affected by parameters of a sample; and utilizing at least one predetermined model to apply model-based processing to the measured data, and determine, for each of one or more parameters of interest, an estimated upper bound value for an individual measurement for said parameter, and generate output data indicative thereof;

wherein said data processing comprises:

applying a training stage to at least one predetermined model to obtain a corresponding at least one trained model and using said trained model to determine a functional relation between the measured signals and upper bounds of errors for sample's parameters affecting the measured signals; and performing an inference test stage by applying said functional relation to the measured data, to associate the estimated upper bound of the error value individually with each of said one or more parameters of a sample being measured;

wherein said data processing comprises determining the relation between the distance metric $D_E$ in the error parametric space and the upper bound for each individual error component of said $N_p$ error components of the error vector.

* * * * *